(12) United States Patent
Chen et al.

(10) Patent No.: US 11,239,225 B2
(45) Date of Patent: Feb. 1, 2022

(54) THREE-DIMENSIONAL INTEGRATED CIRCUIT STRUCTURES AND METHODS OF MANUFACTURING THE SAME

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/515,003

(22) Filed: Jul. 17, 2019

(65) Prior Publication Data

US 2021/0020601 A1  Jan. 21, 2021

(51) Int. Cl.
| | | |
|---|---|---|
| *H01L 25/00* | (2006.01) | |
| *H01L 21/02* | (2006.01) | |
| *H01L 23/31* | (2006.01) | |
| *H01L 25/065* | (2006.01) | |
| *H01L 21/56* | (2006.01) | |
| *H01L 23/48* | (2006.01) | |
| *H01L 23/00* | (2006.01) | |

(52) U.S. Cl.
CPC .......... *H01L 25/50* (2013.01); *H01L 21/0228* (2013.01); *H01L 21/02271* (2013.01); *H01L 21/02274* (2013.01); *H01L 23/3185* (2013.01); *H01L 23/3192* (2013.01); *H01L 25/0652* (2013.01); *H01L 21/56* (2013.01); *H01L 23/481* (2013.01); *H01L 24/06* (2013.01); *H01L 24/13* (2013.01); *H01L 2224/02331* (2013.01); *H01L 2224/0401* (2013.01); *H01L 2224/13024* (2013.01)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |

(Continued)

*Primary Examiner* — Steven B Gauthier
(74) *Attorney, Agent, or Firm* — JCIPRNET

(57) ABSTRACT

Three-dimensional integrated circuit structures and methods of forming the same are disclosed. One of the three-dimensional integrated circuit structures includes a first die, a plurality of second dies and a dielectric structure. The second dies are bonded to the first die. The dielectric structure is disposed between the second dies. The dielectric structure includes a first dielectric layer and a second dielectric layer. The first dielectric layer has a sidewall and a bottom, a first surface of the sidewall and a first surface of the bottom are in contact with the second dielectric layer and form a first angle. A second angle smaller than the first angle is formed by a second surface of the sidewall and a second surface of the bottom.

20 Claims, 13 Drawing Sheets

(56) References Cited

U.S. PATENT DOCUMENTS

| | | |
|---|---|---|
| 9,666,502 B2 | 5/2017 | Chen et al. |
| 9,735,131 B2 | 8/2017 | Su et al. |
| 2017/0133351 A1* | 5/2017 | Su .......................... H01L 25/105 |

* cited by examiner

THREE-DIMENSIONAL INTEGRATED CIRCUIT STRUCTURES AND METHODS OF MANUFACTURING THE SAME

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Some types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
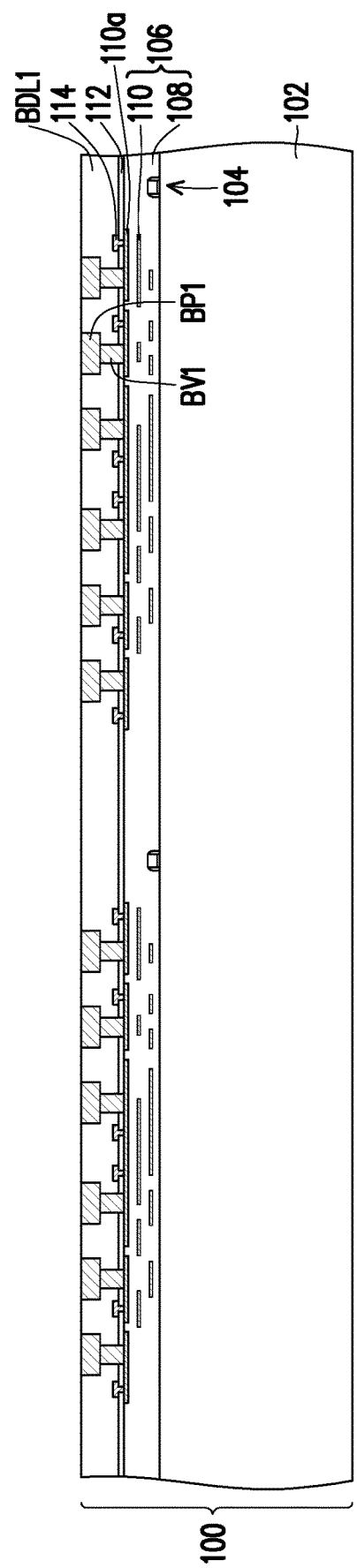
FIG. 1A to FIG. 1H are cross-sectional views of respective intermediate structures during an example method of forming a three-dimensional integrated circuit structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are cross-sectional views of respective intermediate structures during an example method of forming a three-dimensional integrated circuit structure in accordance with some embodiments.

Referring to FIG. 1A, a first die 100 is provided. The first die 100 may be an application-specific integrated circuit (ASIC) chip, an analog chip, a sensor chip, a wireless and radio frequency chip, a voltage regulator chip or a memory chip, for example. In some embodiments, the first die 100 may include an active component or a passive component. In some embodiments, the first die 100 includes a first semiconductor substrate 102, a first interconnect structure 106 and a first bonding structure BS1.

The first semiconductor substrate 102 includes an elementary semiconductor such as silicon, germanium and/or a compound semiconductor such as silicon germanium, silicon carbide, gallium arsenic, indium arsenide, gallium nitride or indium phosphide. In some embodiments, the first semiconductor substrate 102 includes a silicon-containing material. For example, the first semiconductor substrate 102 is a silicon-on-insulator (SOI) substrate or a silicon substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device. In some embodiments, the first semiconductor substrate 102 may have through substrate vias therein upon the process requirements.

The first semiconductor substrate 102 includes isolation structures defining at least one active area, and at least one first semiconductor device 104 is disposed on/in the active area. The first semiconductor device 104 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the first semiconductor device 104 includes a gate dielectric layer, a gate electrode, source/drain regions, spacers, and the like.

The first interconnect structure 106 is formed over a first side (e.g., front side) of the first semiconductor substrate 102. Specifically, the first interconnect structure 106 is disposed over and electrically connected to the first semiconductor device 104. In some embodiments, the first interconnect structure 106 includes at least one first insulating layer 108 and a plurality of first metal features 110. The first metal features 110 are disposed in the first insulating layer 108 and electrically connected with each other. A portion of the first metal features 110, such as first top metal features 110a, are exposed by the first insulating layer 108. In some embodiments, the first insulating layer 108 includes an inter-layer dielectric (ILD) layer on the first semiconductor substrate 102, and at least one inter-metal dielectric (IMD) layer over the inter-layer dielectric layer. In some embodiments, the first insulating layer 108 includes silicon oxide, silicon oxynitride, silicon nitride, a low dielectric constant (low-k) material or a combination thereof. The first insulating layer 108 may be a single layer or a multiple-layer structure. In some embodiments, the first metal features 110 include metal plugs and metal lines. The plugs may include contacts formed in the inter-layer dielectric layer, and vias formed in the inter-metal dielectric layer. The contacts are formed between and in contact with a bottom metal line and the underlying first semiconductor device 104. The vias are formed between and in contact with two metal lines. The first metal features 110 may include tungsten (W), copper (Cu), a copper alloy, aluminum (Al), an aluminum alloy or a combination thereof. In some embodiments, a barrier layer may be disposed between each first metal feature 110 and the first insulating layer 108 to prevent the material of the first metal feature 110 from migrating to the underlying first semiconductor device 104. The barrier layer includes Ta, TaN, Ti, TiN, CoW or a combination thereof, for example. In some embodiments, the first interconnect structure 106 is formed by a dual damascene process. In some alternative embodiments, the first interconnect structure 106 is formed by multiple single damascene processes. In yet alternative embodiments, the first interconnect structure 106 is formed by an electroplating process.

In some embodiments, a first passivation layer 112 is optionally formed over the first interconnect structure 106. The first passivation layer 112 covers the first insulating material 108 and exposes portions of the first top metal features 110a. In some embodiments, the first passivation layer 112 includes silicon oxide, silicon nitride, benzocyclobutene (BCB) polymer, polyimide (PI), polybenzoxazole (PBO) or a combination thereof, and is formed by a suitable process such as spin coating, CVD (chemical vapor deposition) process or the like.

The first pad 114 is formed over and electrically connected to the first interconnect structure 106. In some embodiments, the first pad 114 is further extended into the first passivation layer 112, so as to electrically connect to the first top metal feature 110a. The first pad 114 and the first metal feature 110 may have the same or different materials. In some embodiments, a material of the first pad 114 may include a metal material, such as aluminum, copper, nickel, gold, silver, tungsten, or a combination thereof. The first pad 114 may be formed by forming a via hole to expose the first top metal feature 110a, depositing a metal material layer to fill in the opening and cover the first passivation layer 112 through a suitable process such as electro-chemical plating process, CVD process, atomic layer deposition (ALD) process, PVD process or the like, and then patterning the metal material layer. In some embodiments, a thickness of the first pad 114 may range from 1 µm to 3 µm, for example.

The first bonding structure BS1 is disposed over the first side (e.g., front side) of the first semiconductor substrate 102. Specifically, the first bonding structure BS1 is disposed over the first interconnect structure 106 or the first passivation layer 112. In some embodiments, the first bonding structure BS1 includes at least one first bonding dielectric layer BDL1 and a plurality of first bonding metal features. In some embodiments, the first bonding dielectric layer BDL1 includes silicon oxide, silicon nitride, a polymer or a combination thereof. The first bonding metal features are disposed in the first bonding dielectric layer BDL1 and electrically connected with each other. In some embodiments, the first bonding metal features may include first bonding pads BP1 and first bonding vias BV1. Specifically, as shown in FIG. 1A, the first bonding pads BP1 are electrically connected to the first bonding vias BV1 and therefore the first top metal features 110a. The first bonding metal features may include tungsten (W), copper (Cu), a copper alloy, aluminum (Al), an aluminum alloy or a combination thereof. In some embodiments, a barrier layer (not shown) may be disposed between each first bonding metal feature and the first bonding dielectric layer BDL1. The barrier layer includes Ta, TaN, Ti, TiN, CoW or a combination thereof, for example. In some embodiments, the first bonding structure BS1 is formed by a dual damascene process. In some alternative embodiments, the first bonding structure BS1 is formed by multiple single damascene processes. In yet alternative embodiments, the first bonding structure BS1 is formed by an electroplating process.

Figure 1B:
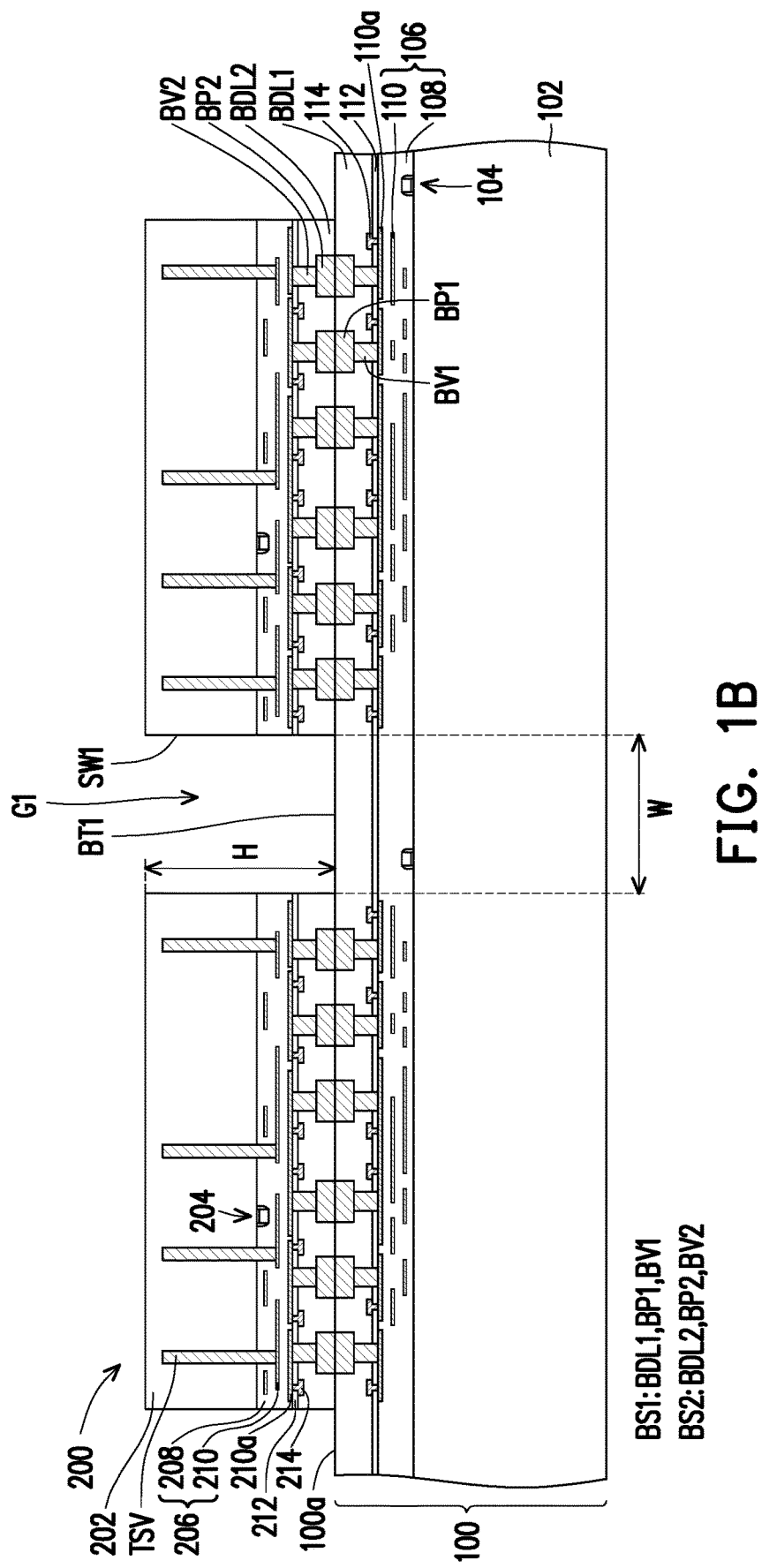

Referring to FIG. 1B, a plurality of second dies 200 are provided. The second die 200 may be an application-specific integrated circuit (ASIC) chip, an analog chip, a sensor chip, a wireless and radio frequency chip, a voltage regulator chip or a memory chip, for example. The second dies 200 may be the same type or different types of dies. The second dies 200 may be referred to as a second die and a third die in the description of some embodiments for comprehension. In some embodiments, the second die and the third die are used to indicate dies that are being disposed on (or over) the first die 100, and the second and third dies may be the same or different types of dies. The second die 200 and the first die 100 may be the same type or different types of dies. In some embodiments, the second die 200 may include an active component or a passive component.

The second die 200 may have a structure similar to that of the first die 100. In some embodiments, the second die 200 includes a second semiconductor substrate 202, a second interconnect structure 206, a second pad 214 and a second bonding structure BS2. Thus, the difference between the second die 200 and the first die 100 is illustrated in details below and the similarity between them is not iterated herein.

The second semiconductor substrate 202 may be similar to the first semiconductor substrate 102 in terms of materials and configurations. In some embodiments, the second semiconductor substrate 202 includes isolation structures defining at least one active area, and at least one second semiconductor device 204 is disposed on/in the active area. The second semiconductor device 204 includes one or more functional devices. In some embodiments, the functional devices include active components, passive components, or a combination thereof. In some embodiments, the functional devices may include integrated circuits devices. The functional devices are, for example, transistors, capacitors, resistors, diodes, photodiodes, fuse devices and/or other similar devices. In some embodiments, the second semiconductor device 204 includes a gate dielectric layer, a gate electrode, source/drain regions, spacers, and the like.

In some embodiments, the second die 200 further includes through substrate vias TSV that penetrate through the second semiconductor substrate 202. In some embodiments, the through substrate vias TSV are called "through silicon vias" when the second semiconductor substrate 202 is a silicon-containing substrate. The through substrate vias TSV are electrically connected to the second interconnect structure 206 and the to-be-formed redistribution layer structure 302 (shown in FIG. 1H). In some embodiments, the through substrate vias TSV include conductive vias. The conductive vias include copper, a copper alloy, aluminum, an aluminum alloy or a combination thereof. In some embodiments, each through substrate via TSV further includes a diffusion barrier layer between the conductive via and the second semiconductor substrate 202. The diffusion barrier layer includes Ta, TaN, Ti, TiN, CoW or a combination thereof.

The second interconnect structure 206 may have a structure similar to that of the first interconnect structure 106. In some embodiments, the second interconnect structure 206 is disposed over a first side (e.g., front side) of the second semiconductor substrate 202. Specifically, the second interconnect structure 206 is disposed over and electrically connected to the second semiconductor device 204. In some embodiments, the second interconnect structure 206 includes at least one second insulating layer 208 and a plurality of second metal features 210. In some embodiments, the second metal features 210 include metal plugs and metal lines. The second metal features 210 are disposed in the second insulating layer 208 and electrically connected with each other. A portion of the second metal features 210, such as second top metal features 210a, are exposed by the second insulating layer 208.

The second passivation layer 212 may be similar to the first passivation layer 112 in terms of materials and configurations. In some embodiments, a second passivation layer 212 is optionally formed over the second interconnect structure 206. The second passivation layer 212 covers the second insulating layer 208 and exposes portions of the second top metal features 210a.

The second pad 214 may be similar to the first pad 114 in terms of materials and configurations. The second pad 214 is formed over and electrically connected to the second interconnect structure 206. In some embodiments, the second pad 214 is further extended into the second passivation layer 212, so as to electrically connect to the second top metal features 210a.

The second bonding structure BS2 may have a structure similar to that of the first bonding structure BS1. In some embodiments, the second bonding structure BS2 is disposed over the first side (e.g., front side) of the second interconnect structure 206 or the second passivation layer 212. In some embodiments, the second bonding structure BS2 includes at least one second bonding dielectric layer BDL2 and a plurality of second bonding metal features. The second bonding metal features are disposed in the second bonding dielectric layer BDL2 and electrically connected with each other. In some embodiments, the second bonding metal features include second bonding vias BV2 electrically connected to the second top metal features 210a of the second interconnect structure 206 and second bonding pads BP2 electrically connected to the second bonding vias BV2.

One difference between the second die 200 and the first die 100 lies in the die size. The size of the second die 200 is different from (e.g., less than) the size of the first die 100. Herein, the term "size" is referred to the length, width and/or area. For example, as shown in the cross-sectional view of FIG. 1B, the width of the second die 200 is less than the width of the first die 100.

Still referring to FIG. 1B, the second dies 200 are turned upside down and mounted onto a surface 100a of the first die 100. In some embodiments, the surface 100a is a front surface of the first die 100, for example. After bonding, the surface 100a is also a bonding surface between the first die 100 and the second dies 200. The second die 200 is electrically coupled to the first die 100. In some embodiments, the second die 200 and the first die 100 are face-to-face bonded together by the first bonding structure BS1 and the second bonding structure BS2. In some embodiments, before the second die 200 is bonded to the first die 100, the second bonding structure BS2 and the first bonding structure BS1 are aligned, such that the second bonding pads BP2 are bonded to the first bonding pads BP1 and the second bonding dielectric layer BDL2 is bonded to the first bonding dielectric layer BDL1. In some embodiments, the alignment of the first bonding structure BS1 and the second bonding structure BS2 may be achieved by using an optical sensing method. After the alignment is achieved, the first bonding structure BS1 and the second bonding structure BS2 are bonded together by a hybrid bonding including a metal-to-metal bonding and a dielectric-to-dielectric bonding.

As shown in FIG. 1B, after bonding the second dies 200 onto the first die 100, a gap G1 (or also referred to as a die to die space) is formed between the second dies 200. In some embodiments, the gap G1 is formed among sidewalls of the second dies 200 and the surface 100a of the first die 100. The gap G1 has a sidewall SW1 and a bottom BT1. In some embodiments, the sidewall SW1 may be substantially vertical to the bottom BT1, for example. Therefore, the gap G1 may have a uniform width from a bottom to a top. The aspect ratio of the gap G1 is defined as a ratio of a height H to a width W of the gap G1. In some embodiments, the aspect ratio of the gap G1 may be larger than 1, for example. In some embodiments, the width W of the gap G1 may be smaller than 20 μm, and the height H of the gap G1 may be larger than 20 μm. However, the invention is not limited thereto.

Figure 1C:
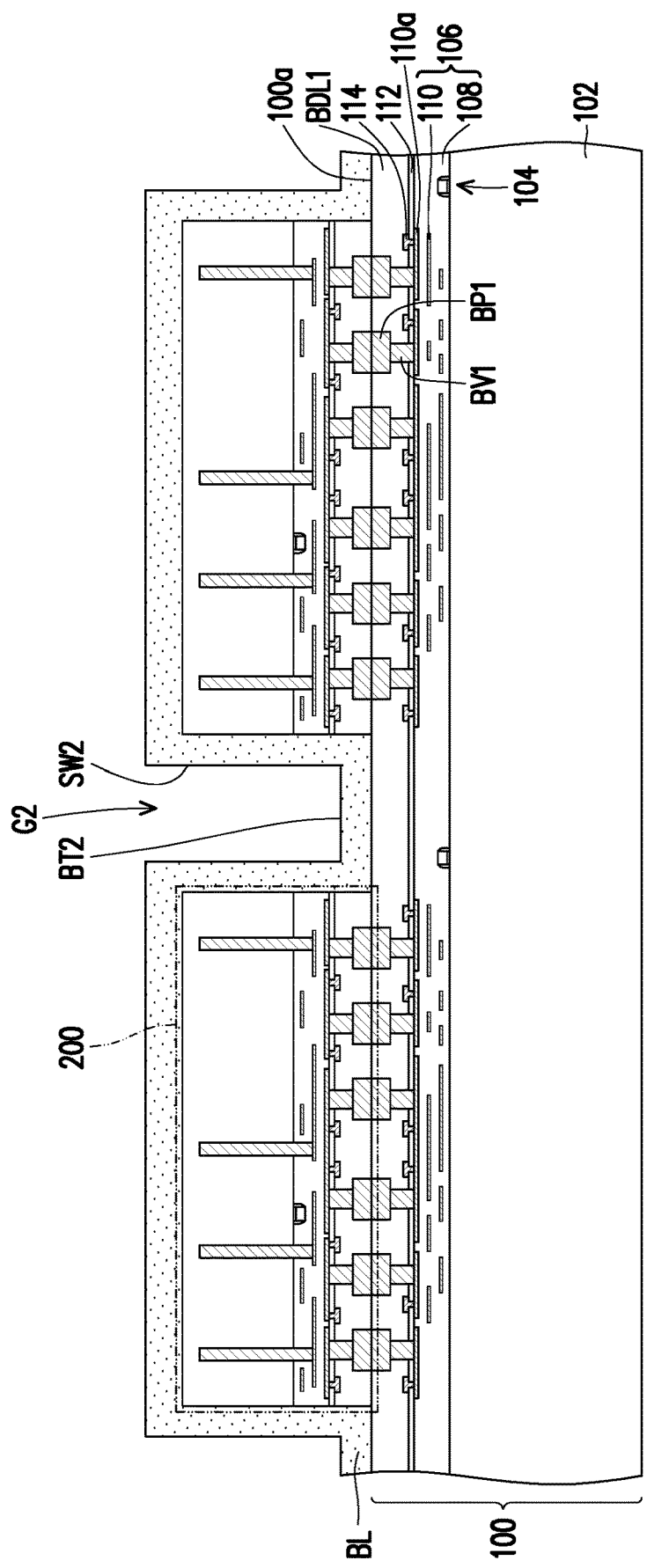

Referring to FIG. 1C to FIG. 1F, a dielectric structure DS is described, where the dielectric structure DS is filled into the gap G1 between the second dies 200 (which may also be referred as a second die and a third die) over the first die 100. In some embodiments, as shown in FIG. 1C, a dielectric layer BL is formed over the first die 100 to cover the second dies 200 and the first die 100 between the second dies 200, and then a gap G2 is formed. The dielectric layer BL may be formed over top surfaces of the second dies 200 and the sidewall SW1 and the bottom BT1 of the gap G1. In some embodiments, the dielectric layer BL is in direct contact with the sidewall SW1 and the bottom BT1 of the gap G1 which are respectively belonging to the sidewalls of the second dies 200 and the surface 100a of the first die 100. In some embodiments, the dielectric layer BL may be formed by a deposition process which provides a good adhesion to the surfaces of the gap G1 and provides a suitable thickness efficiently. Accordingly, the to-be formed dielectric structure DS may be adhered to the first and second dies 100, 200 stably. In some embodiments, the dielectric layer BL may be conformally formed by PECVD (plasma enhanced CVD) process or the like. In other words, the dielectric layer BL may be a conformal layer. Herein, the term "conformal" or "conformally" is used to describe that a material is formed with substantially uniform thickness over the entire sidewall surface of the gap between the second dies. On contrary, the term "non-conformal" or "non-conformally" is used to describe that a material is formed with non-uniform thickness over the entire sidewall surface of the gap between the second dies. The "substantially uniform thickness" refers to a variation of thickness less than about 5%, and "non-uniform thickness" refers to a variation of thickness larger than or equal to 5%.

In some embodiments, the dielectric layer BL may include silicon oxide, silicon nitride or a combination thereof. In some embodiments, a thickness of the dielectric layer BL over the entire surfaces including the top surfaces of the second dies 200 and the sidewall SW1 and the bottom BT1 of the gap G1 may be substantially uniform. In some embodiments, a ratio of the thickness of the dielectric layer BL to the height H of the gap G1 may be in a range of 0.1 to 0.3, for example. When the ratio of the thickness of the dielectric layer BL to the height H of the gap G1 is within the above range, an aspect ratio of the formed gap G2 may be less than the aspect ratio of the gap G1. In an embodiment, the thickness of the dielectric layer BL may range from 5 μm to 15 μm, for example.

In some embodiments, the gap G2 may have a similar profile as the gap G1. In detail, the gap G2 has a sidewall SW2 and a bottom BT2, and the sidewall SW2 may be substantially vertical to the bottom BT2. That is, a top width of the gap G2 may be substantially equal to a bottom width of the gap G2. In some embodiments, the aspect ratio of the gap G2 is defined as a ratio of a height to a width of the gap G2, and the aspect ratio of the gap G2 may be less than 0.8. However, the invention is not limited thereto.

Figure 1D:
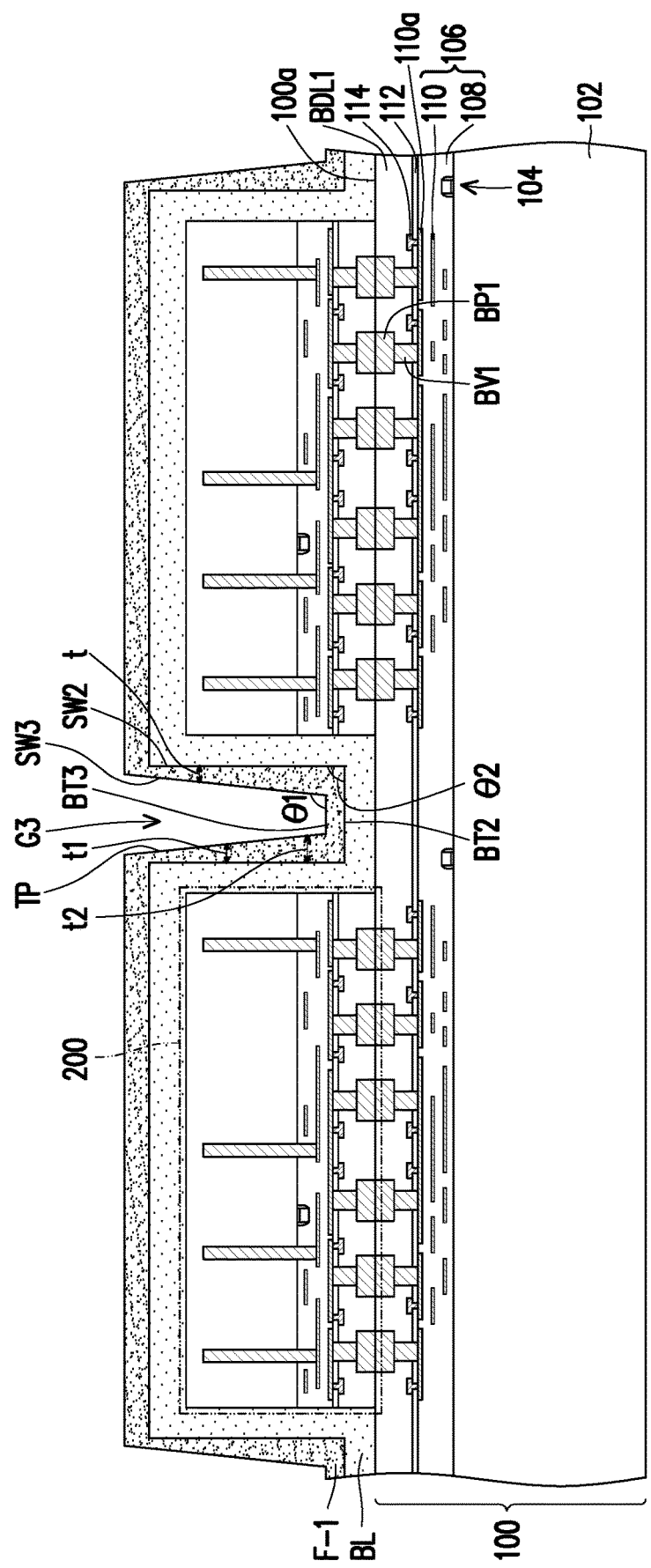
Figure 1E:
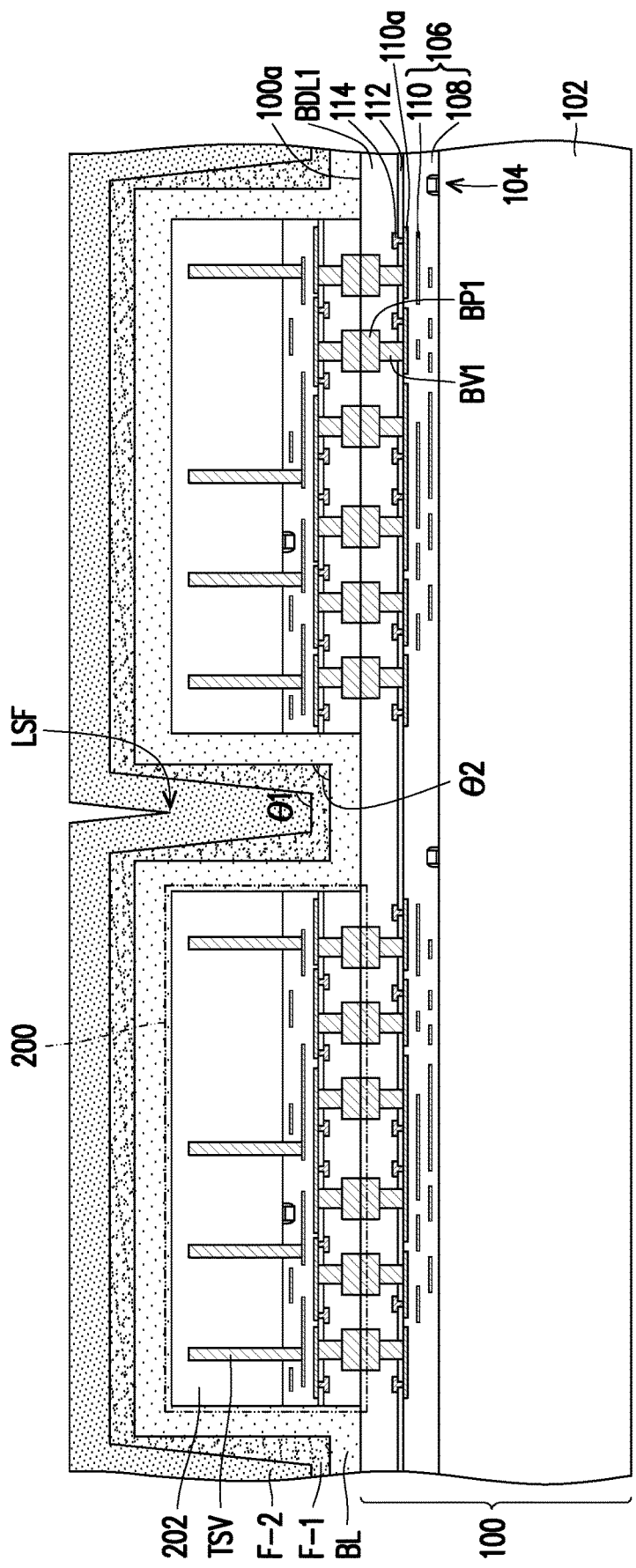
Figure 4A:
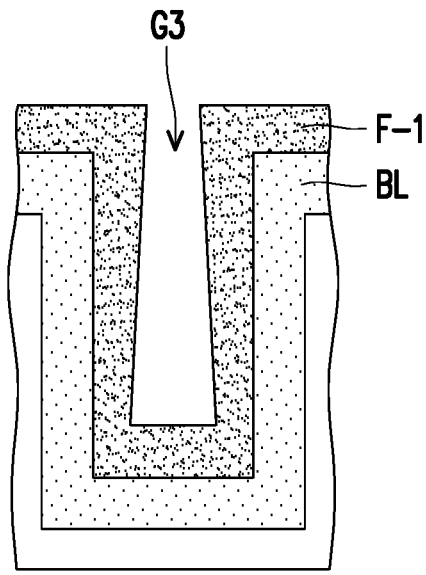
FIG. 4A to FIG. 4D are partial enlarged cross-sectional views of forming a first dielectric layer of a dielectric structure in accordance with some embodiments.
Figure 4B:
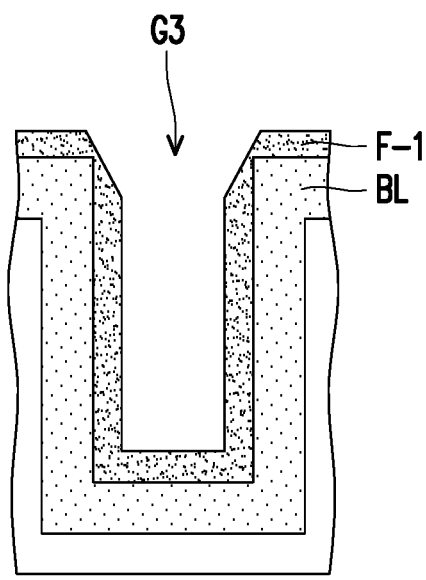
Figure 4C:
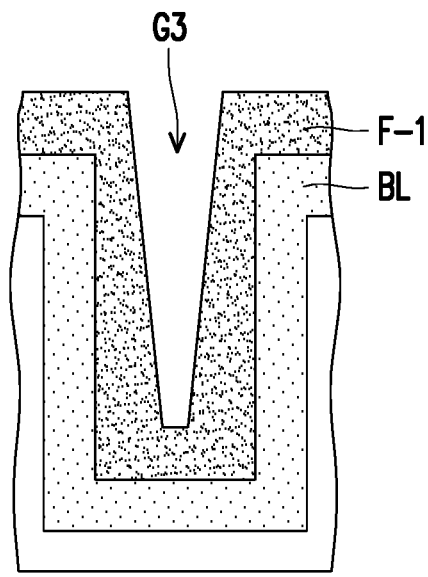
Figure 4D:
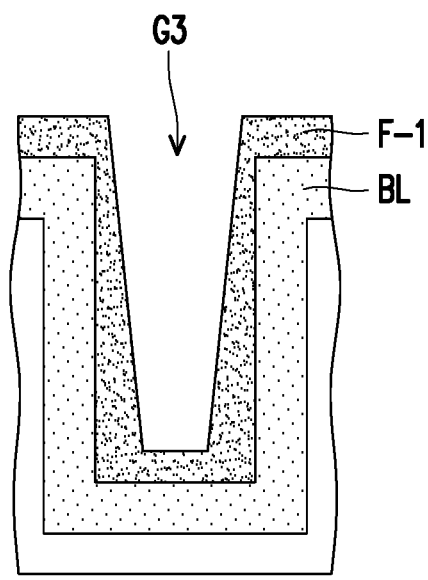

Referring to FIGS. 1D and 1E, a cycle of forming a first dielectric layer F-1 and a second dielectric layer F-2 is performed. First, as shown in FIG. 1D, the first dielectric layer F-1 is formed over the gap G2 between the second dies 200 by a first deposition process, and then a gap G3 is formed. Due to the first deposition process, the first dielectric layer F-1 has a smaller thickness at a top portion of the sidewall SW2 (i.e., the portion of the sidewall SW2 closer to the top surfaces of the second dies 200) of the gap G2 with respect to a bottom portion of the sidewall SW2 of the gap G2 (i.e., the portion of the sidewall SW2 closer to the surface 100a of the first die 100). In other words, the first dielectric layer F-1 has a non-uniform thickness t over the sidewall SW2 of the gap G2, and the thickness t increases as the first dielectric layer F-1 becomes closer to the bottom BT2 of the gap G2. In some embodiments, the first deposition process may be a non-conformal deposition process such as high density plasma chemical vapor deposition (HDP-CVD) process or the like. The HDP-CVD process includes deposition and etching cycle. In detail, the HDP-CVD process may be performed by alternating deposition mode (such as PECVD method) and sputtering mode (such as bias sputtering method), where a deposition rate within the deposition mode is greater than a sputtering rate within the sputtering mode. For example, first, as shown in FIG. 4A, a deposition step is performed, and the opening of the gap G is narrowed. Then, as shown in FIG. 4B, an etching step is performed, and the opening of the gap G is enlarged. After that, as shown in FIG. 4C, a deposition step is performed, and the opening of the gap G is narrowed. Then, as shown in FIG. 4D, an etching step is performed, and the opening of the gap G is enlarged. In some embodiments, by repeating the deposition and etching cycles as shown in FIGS. 4A to 4D, the first dielectric layer F-1 as shown in FIG. 1D may be formed.

In some embodiments, a ratio of the thickness t1 of the first dielectric layer F-1 on the top portion of the gap G2 to the thickness t2 of the first dielectric layer F-1 on the bottom portion of the gap G2 may be in a range of 0.3 to 0.5. In some embodiments, an aspect ratio of the gap G3 may be in a range of 0.3 to 0.5, for example.

In some embodiments, the first dielectric layer F-1 is formed on the dielectric layer BL over the second dies 200 and the gap G2 between the second dies 200. In some embodiments, the first dielectric layer F-1 is formed on the sidewall SW2 and the bottom BT2 of the gap G2. In some alternative embodiments in which the dielectric layer BL is omitted, and the first dielectric layer F-1 may be directly formed on the second dies 200 and the gap G1 between the second dies 200. In other words, the dielectric layer F-1 is physically and directly in contact with the top surfaces and the sidewalls SW1 of the second dies 200 and the surface 100a of the first die 100.

In some embodiments, referring to FIG. 1D, the gap G3 may have a profile different from the gap G2. In some embodiments, but not limited to, a top TP (an opening) of the gap G3 is wider than the bottom of the gap G3. In detail, the gap G3 may be formed with an inclined sidewall SW3 rather than a vertical sidewall, where a distance between an inner surface of the sidewall SW3 and the sidewall SW1 of the closest second die 200 decreases as the sidewall SW3 gets closer to the top TP of the gap G3. In other words, the sidewall SW3 is not vertical to a bottom BT3 of the gap G3 (e.g., the sidewall SW3 and the bottom BT3 are not perpendicular), and an included angle θ1 larger than 90 degrees may be formed between the sidewall SW3 and the bottom BT3. On contrary, as shown in FIGS. 1C and 1D, the sidewall SW2 is substantially vertical to the bottom BT2 of the gap G2 (e.g., the sidewall SW2 and the bottom BT2 are perpendicular), and an included angle θ2 formed between the sidewall SW2 and the bottom BT2 is substantially equal to 90 degrees, for example. In some embodiments, the included angle θ1 of the gap G3 is larger than the included angle θ2. That is, a slope of a sidewall of the gap G3 is larger than a slope of a sidewall of the gap G2, and a profile of the gap between the second dies 200 changes from the gap G2 (which is similar to the initial gap G1 formed between the second dies 200 due to the conformal deposition of the dielectric layer BL) to the gap G3.

Conventionally, when a sidewall of the gap formed between dies is vertical to a bottom surface of the gap, the to-be deposited material may undesirably seal at the top of the gap, that is, the top of the gap is sealed before the gap is fully filled, and this often occurs to a gap having a high aspect ratio. On contrary, in some embodiments, the first dielectric layer F-1 is formed by the non-conformal deposition process, which forms the gap G3 with the inclined sidewall SW3 and having the top wider than the bottom of the gap G3. As a result, the to-be deposited material (such as the material of the second dielectric layer F-2) would not seal at the top TP of the gap G3 easily. In other words, the first dielectric layer F-1 provides a better profile of the gap for the subsequent deposition process.

In some embodiments, the formation of the first dielectric layer F-1 not only provides material to partially fill the gap but also modifies the profile of the gap between the second dies. In some embodiments, a material of the first dielectric layer F-1 may be different from or the same as the material of the dielectric layer BL. The material of the first dielectric layer F-1 may include silicon oxide, silicon nitride or a combination thereof. In some embodiments, a thickness of the first dielectric layer F-1 may be smaller than the thickness of the dielectric layer BS. In some embodiments, the thickness of the first dielectric layer F-1 may range from 0.5 µm to 2 µm, for example. In some alternative embodiments, the thickness of the first dielectric layer F-1 may be equal to or larger than the thickness of the dielectric layer BS, for example.

Referring to FIG. 1E, the second dielectric layer F-2 is formed over the first dielectric layer F-1 by a second deposition process. In some embodiments, the second deposition process may be a conformal deposition process such as PECVD process or the like. In some embodiments, the second dielectric layer F-2 is conformally formed on the first dielectric layer F-1 over the second dies 200 and between the second dies 200. In some embodiments, the second dielectric layer F-2 is formed on the sidewall SW3 and the bottom BT3 of the gap G3. During the second deposition process, the thickness of the second dielectric layer F-2 on the sidewall SW3 of the gap G3 is substantially uniform, for example. Since the sidewall SW3 of the gap G3 is inclined rather than vertical, the top TP of the gap G3 would not be sealed easily by the to-be deposited material before the gap G3 is completely filled. Accordingly, the second dielectric layer F-2 may fill the gap G3 without the voids therein.

In some embodiments, the second dielectric layer F-2 is configured to fill completely the gap G3, and thus as shown in FIG. 1E, the lowest surface LSF of the second dielectric layer F-2 is higher than or substantially flush with the top surfaces of the second dies 200. In other words, the space between the second dies 200 is completely filled. In some alternative embodiments, the lowest surface LSF of the second dielectric layer F-2 may be higher than or substantially flush with the top surfaces of the through substrate vias TSV. In some alternative embodiments, if the space between the second dies 200 is not completely filled after one cycle of forming a first dielectric layer and a second dielectric layer, at least one cycle of forming a first dielectric layer and a second dielectric layer may be performed again until the space is filled.

In some embodiments, the formation of the first dielectric layer F-1 is mainly provided for forming a gap with the inclined sidewall, and the formation of the second dielectric layer F-2 is mainly provided to fill the gap completely. Thus, the formation of the first dielectric layer F-1 may be also referred as a gap-profile modifying step, and the formation of the second dielectric layer F-2 may be also referred as a gap-filling step. In some embodiments, a thickness of the second dielectric layer F-2 may be larger than the thickness of the first dielectric layer F-1. For example, the thickness of the second dielectric layer F-2 may range from 5 µm to 15 µm. When the thickness is less than 5 µm, the gap G3 may not be filled completely, and when the thickness is larger than 15 µm, the void may be formed in the second dielectric layer F-2. However, in some alternative embodiments, the thickness of the second dielectric layer F-2 may be smaller than or equal to the thickness of the first dielectric layer F-1. In some embodiments, a material of the second dielectric layer F-2 may be different from or the same as the material of the first dielectric layer F-1. The material of the second dielectric layer F-2 may include silicon oxide, silicon nitride or a combination thereof.

Figure 1F:
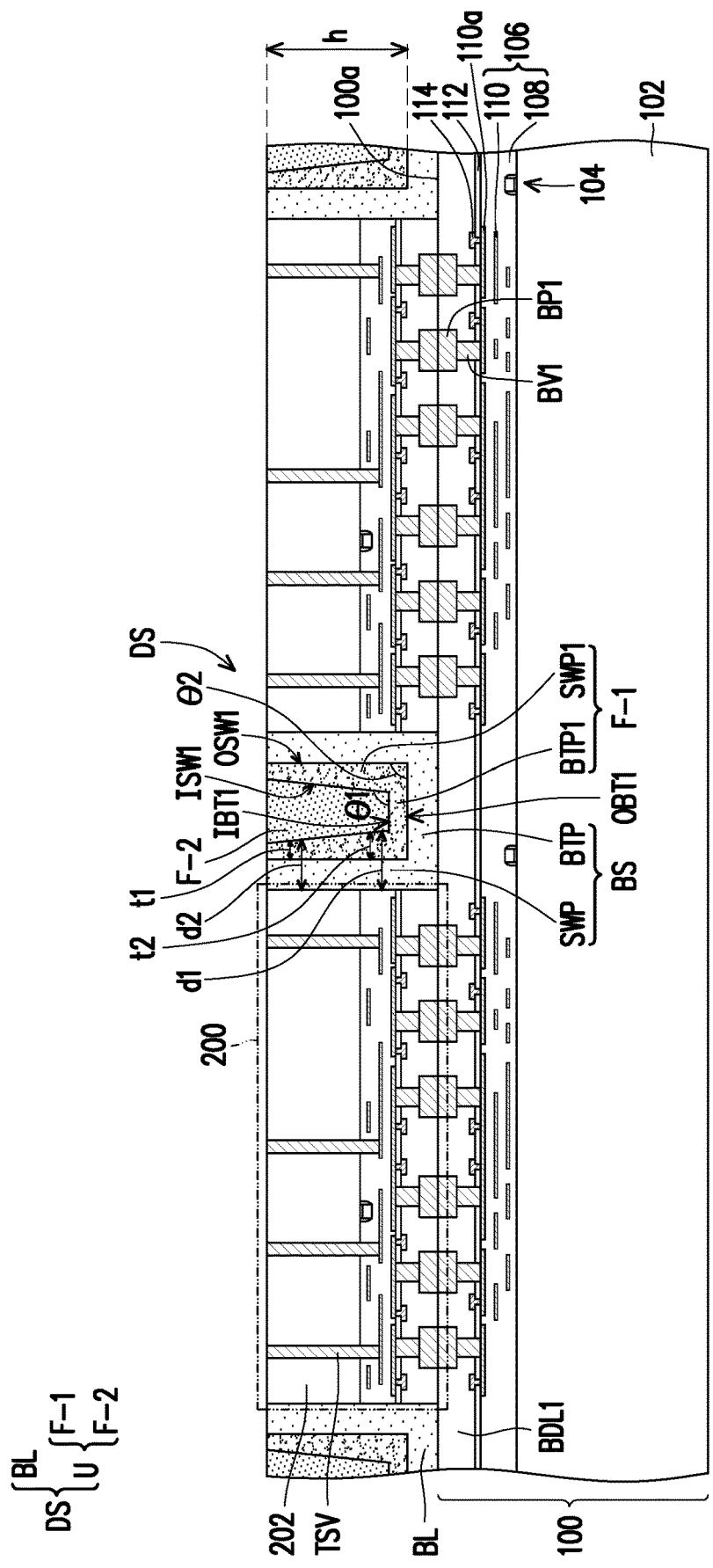

Referring to FIG. 1F, a planarization process is performed, so as to form the dielectric structure DS in the gap G1 between the second dies 200. In some embodiments, by using the through substrate vias TSV as stop layers, portions of the dielectric layer BL, the first dielectric layer F-1 and the second dielectric layer F-2 are removed. In addition, portions of the second semiconductor substrates 202 of the second dies 200 are partially removed to expose the through substrate vias TSV. Accordingly, the top surfaces of the second semiconductor substrates 202 and the dielectric structure DS may be flush with the top surfaces of the through substrate vias TSV. In some embodiments, the planarization process is a chemical mechanical polish process or the like.

In some embodiments, as shown in FIG. 1F, the dielectric structure DS includes the dielectric layer BL, the first dielectric layer F-1 and the second dielectric layer F-2 from the outer to the inner. In some embodiments, the top surfaces of the dielectric layer BL, the first dielectric layer F-1 and the second dielectric layer F-2 are substantially flush with each other, and the top surface of the dielectric structure DS is substantially flush with the top surfaces of the second dies 200. In some embodiments, the dielectric layer BL is the outermost dielectric layer, the second dielectric layer F-2 is the innermost dielectric layer, and the first dielectric layer F-1 is disposed between the dielectric layer BL and the second dielectric layer F-2, for example. However, the invention is not limited thereto. In some alternative embodiments, more dielectric layers may be disposed between the outermost dielectric layer and the innermost dielectric layer.

In some embodiments, the dielectric layer BL and the first dielectric layer F-1 are configured to accommodate the subsequent deposited material, and thus the dielectric layer BL and the first dielectric layer F-1 are respectively U-shaped. In some embodiments, the dielectric layer BL is in direct contact with the sidewalls of the second dies 200. The dielectric layer BL has a bottom BTP and a sidewall SWP, and the sidewall SWP extends upwards from an edge of the bottom BTP. In some embodiments, the dielectric layer BL is conformally formed over the sidewalls of the second dies 200 and a portion of the surface 100a of the first die 100 between the second dies 200, for example. Since the sidewalls of the second dies 200 are substantially vertical to the surface 100a of the first die 100, the sidewall SWP is substantially vertical to the bottom BTP. In some embodiments, the dielectric layer BL is used to protect the second dies 200, for example.

In some embodiments, the first dielectric layer F-1 and the second dielectric layer F-2 are collectively referred to as an unit U. In some embodiments, the first dielectric layer F-1 has a bottom BTP1 and a sidewall SWP1 extending upwards from an edge of the bottom BTP1. The sidewall SWP1 has an inner surface ISW1 and an outer surface OS which is opposite to the inner surface ISW1. The inner surface ISW1 faces the second dielectric layer F-2, and the outer surface OSW1 faces the second dies 200. A distance between the inner surface ISW1 of the sidewall SWP1 and the closest second die 200 is larger than a distance between the outer surface OSW1 of the sidewall SWP1 to the closest second die 200. The bottom BTP1 has an inner surface IBT1 and an outer surface OBT1 which is opposite to the inner surface IBT1. A distance between the inner surface IBT1 of the bottom BTP1 and the first die 100 is smaller than a distance between the outer surface OBT1 of the bottom BTP1 to the surface 100a of the first die 100. In some embodiments, the inner surface IBT1 is an upper surface, and the outer surface OBT1 is a lower surface, for example. The inner surface ISW1 of the sidewall SWP1 is physically connected to the inner surface IBT1 of the bottom BTP1, and the outer surface OSW1 of the sidewall SWP1 is physically connected to the outer surface OBT1 of the bottom BTP1.

The inner surfaces ISW1, IBT1 are in contact with the second dielectric layer F-2, and the inner surfaces ISW1, IBT1 of the first dielectric layer F-1 are the surfaces on which the material (such as the material of the second dielectric layer F-2) is subsequently deposited. As shown in FIG. 1F, an included angle θi is formed between the inner surface IS of the sidewall SWP1 and the inner surface IBT1 of the bottom BT1. An included angle θ2 is formed between the outer surface OSW1 of the sidewall SWP1 and the outer surface OBT1 of the bottom BT1. The included angle θ1 is larger than the included angle θ2. In some embodiments, the included angle θ2 is substantially equal to 90 degrees, and the included angle θ1 is larger than 90 degrees.

From another aspect, the inner and outer surfaces of the first dielectric layer may be described with by their respective slope. In some embodiment, slope is defined as an inclined level (gradient) of the sidewall with respect to the surface 100a of the first die 100. In detail, the slope is minimum when a sidewall is parallel to the surface 100a of the first die 100, and the slope is maximum when a sidewall is vertical to the surface 100a of the first die 100. In some embodiments, the sidewall SWP1 at one side (e.g. left side or right side of the gap) is disposed between one second die 200 at the same side as the sidewall SWP1 (e.g. the second die 200 at left side or right side) and the second dielectric layer F-2. A slope of the inner surface ISW1 is smaller than a slope of the outer surface OSW1 of the same sidewall SWP1 (e.g. the sidewall SWP1 at the first side) with respect to the surface 100a of the first die 100. In other words, with respect to the surface 100a of the first die 100, the inner surface IS slopes more gently than the outer surface OSW1 of the sidewall SWP1 of the first dielectric layer F-1. In some embodiments, the slope of the outer surface OSW1 of the sidewall SWP1 is maximum when the outer surface OSW1 of the sidewall SWP1 is substantially vertical to the surface 100a of the first die 100. In some embodiments, the outer surface OSW1 is also the inner surface of the sidewall SWP of the dielectric layer BL, and thus the inner surface ISW1 of the sidewall SWP1 of the first dielectric layer F-1 slopes more gently than the inner surface of the sidewall SWP of the dielectric layer BL. In some embodiments, the outer surface OBT1 of the bottom BTP1 and the inner surface IBT1 of the bottom BTP1 may be substantially parallel to the surface 100a of the first die 100, for example.

In some embodiments, since the inner surface ISW1 slopes more gently than the outer surface OSW1 of the sidewall SWP1 of the first dielectric layer F-1, a thickness t2 of the lower sidewall SWP1 (e.g., a portion of the sidewall SWP1 closer to the first die 100) is larger than a thickness t1 of the upper sidewall SWP1. In other words, a thickness between the inner surface ISW1 and the outer surface OSW1 of the sidewall SWP1 increases as the sidewall SWP1 becomes closer to the bottom BTP1. A horizontal distance d1 between the inner surface ISW1 of the lower sidewall SWP1 and the sidewall of the second die 200 is larger than a horizontal distance d2 between the inner surface ISW1 of the upper sidewall SWP1 and the sidewall of the same second die 200. In other words, a distance between the inner surface IS of the sidewall SWP1 and the second die 200 increases as the inner surface ISW1 becomes closer to the bottom BTP1. On contrary, in the dielectric layer BS which is conformally deposited, a thickness of the lower sidewall SWP may be substantially the same as a thickness of the upper sidewall SWP. In other words, the thickness of the sidewall SWP of the dielectric layer BS may be substantially constant. In addition, a horizontal distance between the inner surface of the lower sidewall SWP and the sidewall of the second die 200 is substantially the same as a horizontal distance between the inner surface of the upper sidewall SWP and the sidewall of the same second die 200. That is, the horizontal distance between the inner surface of the upper sidewall SWP and the sidewall of the same second die 200 may be substantially constant.

In some embodiments, the second dielectric layer F-2 is disposed in and on the first dielectric layer F-1. In some embodiments, the second dielectric layer F-2 is configured to completely fill the gap G3 formed by the first dielectric layer F-1, and thus the second dielectric layer F-2 is inverted trapezoid-shaped, for example. In detail, the second dielectric layer F-2 has a top surface, a bottom surface and a sidewall surface. In some embodiments, the sidewall surface and the bottom surface of the second dielectric layer F-2 are encapsulated by the first dielectric layer F-1, and the top surface of the second dielectric layer F-2 is substantially flush with a top surface of the second dielectric layer F-2. In some embodiments, the dielectric layer BL is the outermost dielectric layer, however, in some alternative embodiments, the dielectric layer BL may be omitted. In other words, the first dielectric layer F-1 of the unit U may be in direct contact with the sidewalls of the second dies 200. In addition, in some embodiments, the dielectric structure DS includes only one unit U and thus the second dielectric layer F-2 completely fills the gap G3, however, the invention is not limited thereto. In some alternative embodiments, the dielectric structure DS may include more units.

Figure 1G:
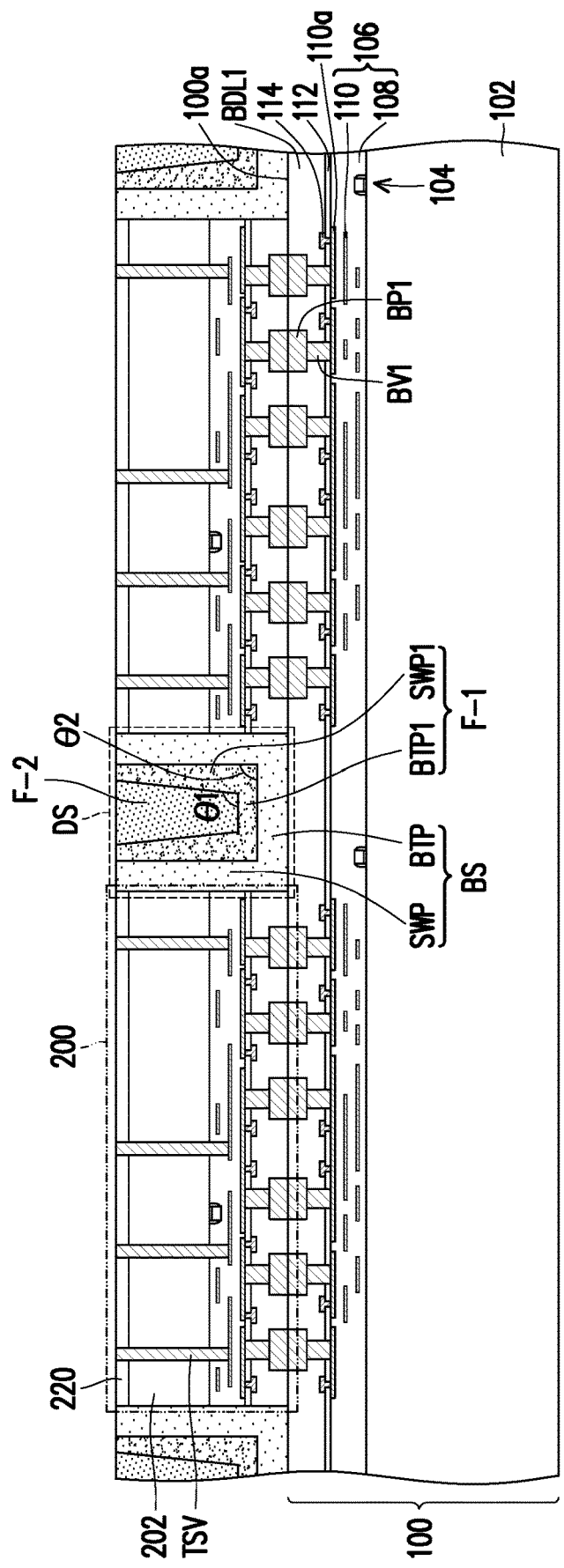

Referring to FIG. 1G, in some embodiments, after the planarization process, portions of the second semiconductor substrates 202 are further removed, so that the through substrate vias TSV are protruded from the second semiconductor substrates 202. Then, a dielectric layer 220 may be respectively formed over the second semiconductor substrate 202 to encapsulate the through substrate vias TSV. In some embodiments, the dielectric layer 220 may be formed by a deposition process and a subsequent planarization process, for example.

Figure 1H:
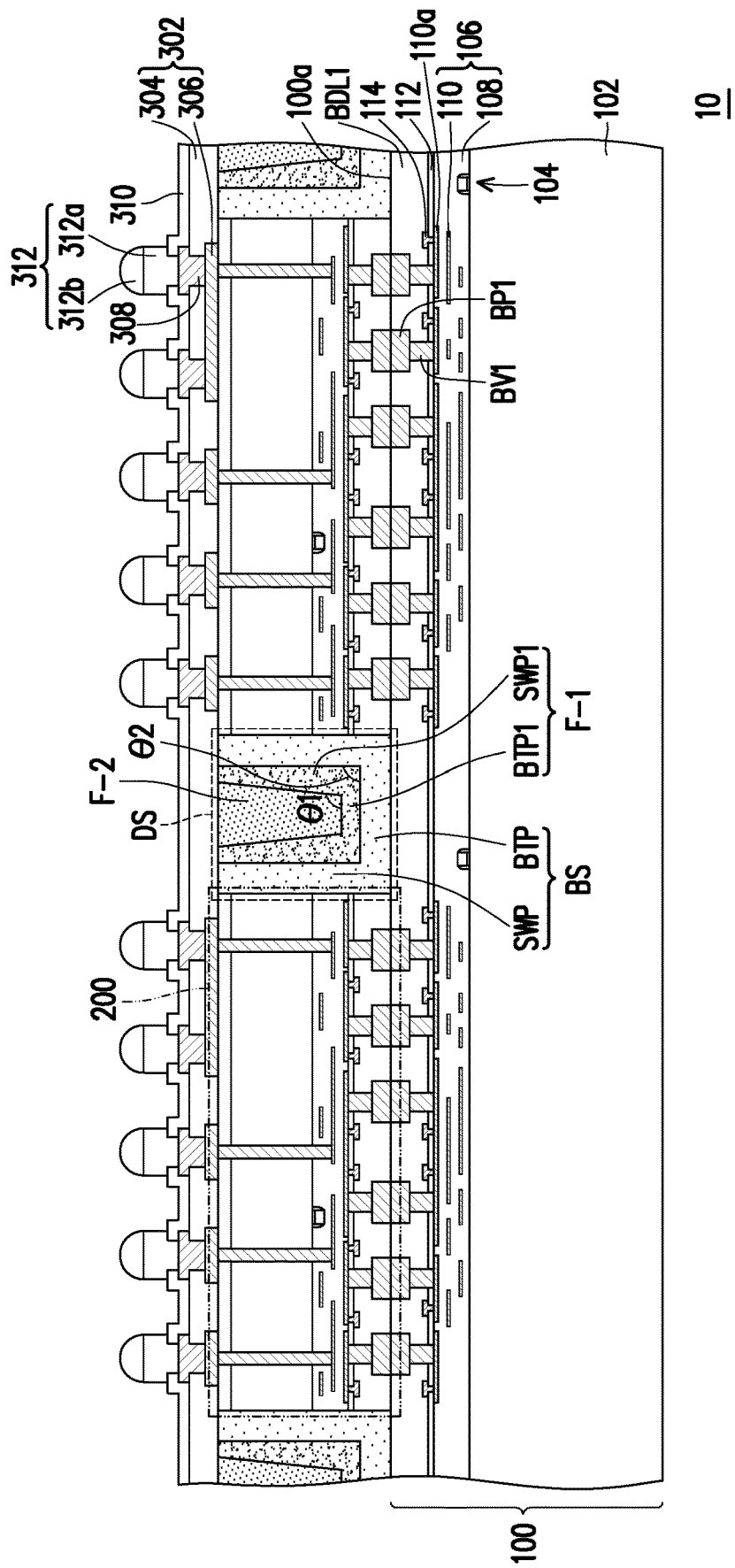

Referring to FIG. 1H, a redistribution layer structure 302 is formed over the second side (e.g., back side) of the second dies 200 and the dielectric structure DS. The redistribution layer structure 302 includes at least one dielectric layer 304 and at least one conductive layer 306 stacked alternately. In some embodiments, the redistribution layer structure 302 is electrically connected to the through substrate vias TSV of the second dies 200. In some embodiments, the dielectric layer 304 includes a photo-sensitive material such as polybenzoxazole (PBO), polyimide (PI), benzocyclobutene (BCB), a combination thereof or the like. In some embodiments, the conductive layer 306 includes copper, nickel, titanium, a combination thereof or the like. In some embodiments, a barrier layer may be disposed between the conductive layer 306 and the dielectric layer 304. The barrier layer includes Ta, TaN, Ti, TiN, CoW or a combination thereof, for example. In some embodiments, the redistribution layer structure 302 is formed by a dual damascene process. In some alternative embodiments, the redistribution layer structure 302 is formed by multiple single damascene processes. In yet alternative embodiments, the redistribution layer structure 302 is formed by an electroplating process.

Thereafter, pads 308 are formed over the redistribution layer structure 302. In some embodiments, the pads 308 are under bump metallization (UBM) pads for mounting conductive connectors, such as metal pillars, μ-bumps or the like. The pads 308 include a metal or a metal alloy. The pads 308 include aluminum, copper, nickel, or an alloy thereof.

Afterwards, a passivation layer 310 covers the dielectric layer 304 and edge portions of the pads 308, and exposes the center portions of the pads 308. In some embodiments, the passivation layer 310 includes silicon oxide, silicon nitride, benzocyclobutene (BCB) polymer, polyimide (PI), polybenzoxazole (PBO) or a combination thereof.

Then, external terminal(s) 312 may be formed to electrically connect the pads 308. For example, a plurality of external terminals 312 (e.g., conductive balls/bumps) arranged in array are formed on the external contact pads 308. In some embodiments, the external terminals 312 may be solder balls formed by ball placement and reflowing processes. In some embodiments, the external terminals 312 may include a conductive pillar 312a and a bump 312b on the conductive pillar 312a, for example. In some other embodiments, the external terminals 312 may be or may include copper pillars, controlled collapse chip connection (C4) bumps, micro-bumps, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like. It should be noted that any suitable external terminals, and any suitable process for forming the external terminals, may be utilized for the external terminals 312.

In some embodiments, after the external terminals 312 are formed, a three-dimensional integrated circuit (3DIC) structure 10 of the application is thus completed. In some embodiments, the 3DIC structure 10 may be a small outline integrated circuit (SOIC) structure, for example.

As the die to die space (the gap between the dies) is getting narrow, the gap-filling process is a critical process. Conventionally, after repeatedly performing the deposition processes, the top of the gap may be undesirably sealed by the deposited material before the gap is completely filled. Accordingly, the deposited material in the gap is formed with a void therein. This is often seen in the filling of a gap having high aspect ratio by a conformal deposition such as PECVD. Although the non-conformal deposition process such as HDP-CVD may fill the gap more completely, the deposition rate of the HDP-CVD is slow, and the cost thereof is high. In some embodiments, by performing the non-conformal deposition process (e.g., HDP-CVD) before the conformal deposition process (e.g., PECVD) or between conformal deposition processes, the profile of the gap may be modified. That is, the sidewall of the gap slopes gently than the initial gap between the second dies, as to keep the top of the gap wider than the bottom of the gap. Therefore, the top of the gap would not be sealed by the to-be deposited material easily, and the gap may be filled completely with the deposited materials without the voids therein. Accordingly, by combining the benefits of both the conformal deposition process and non-conformal deposition process, the gap may be filled completely and efficiently, and the performance of the 3DIC structure is improved.

Figure 2A:
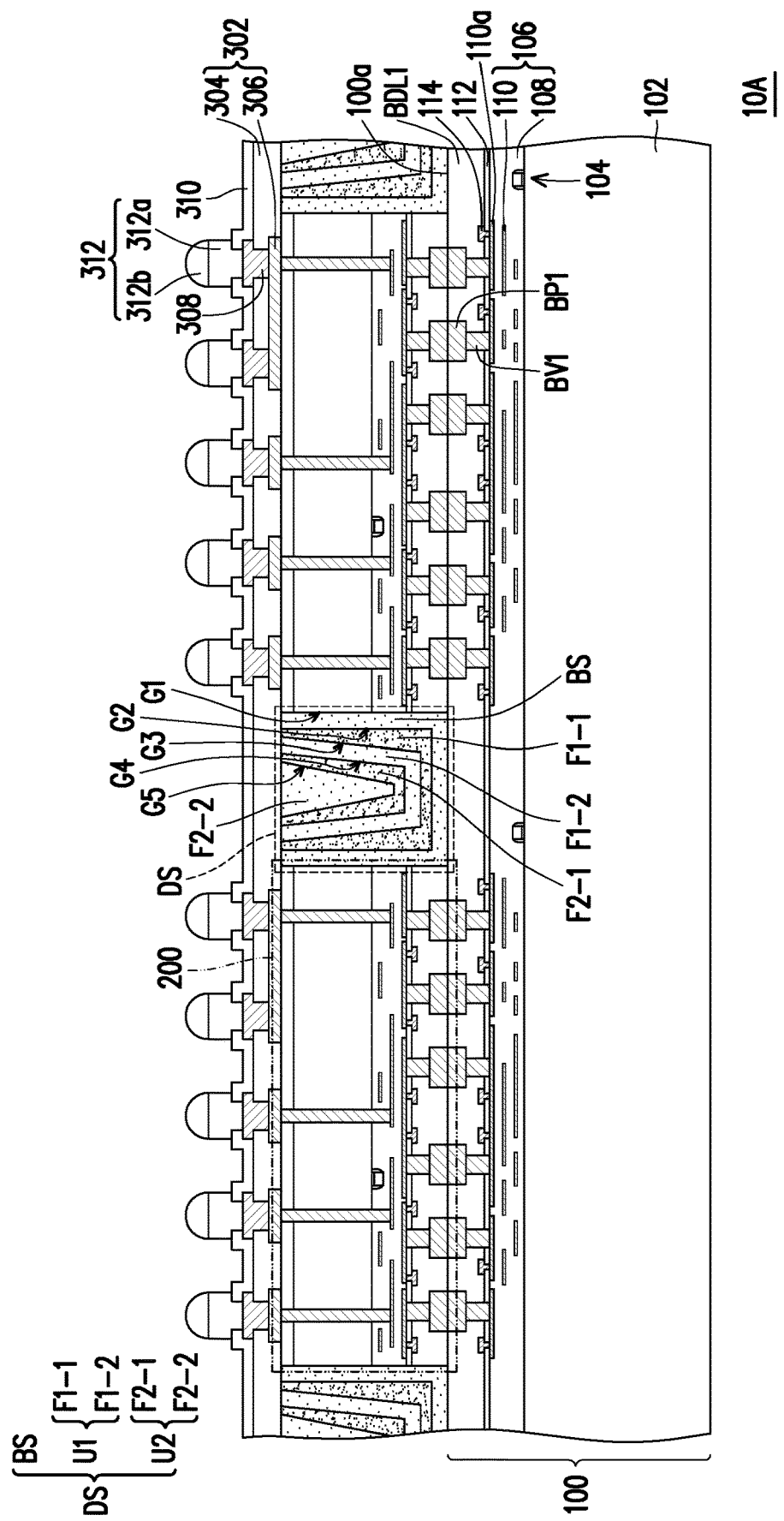
FIG. 2A is a cross-sectional view of a 3DIC structure in accordance with some embodiments of the disclosure.
Figure 2B:
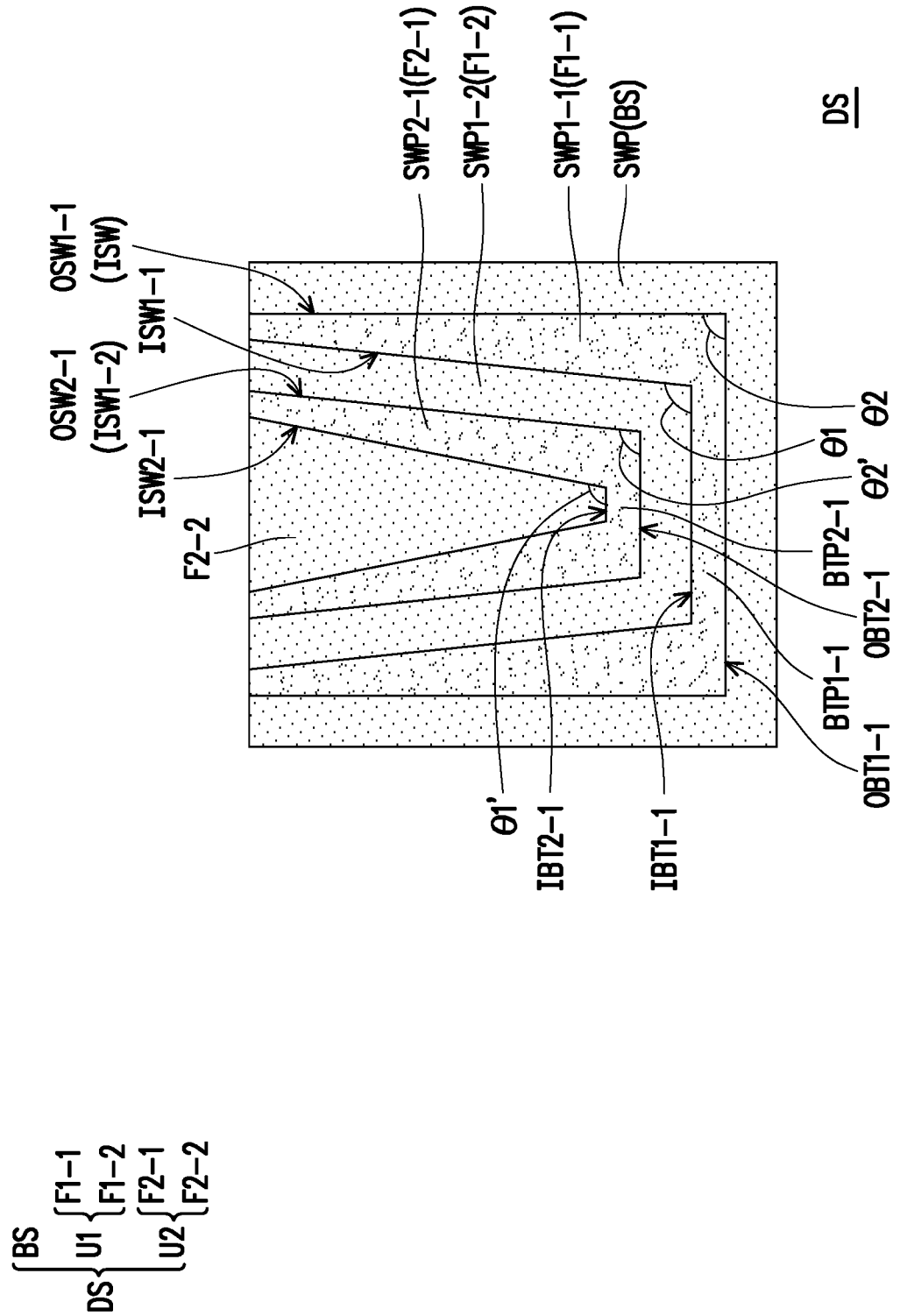
FIG. 2B is a partial enlarged view of a dielectric structure of FIG. 2A.

FIG. 2A is a cross-sectional view of a 3DIC structure in accordance with some embodiments of the disclosure, and FIG. 2B is a partial enlarged view of a dielectric structure of FIG. 2A. The 3DIC structure illustrated in FIG. 2A is similar to the 3DIC structure illustrated in FIG. 1H, hence the same reference numerals are used to refer to the same and liked parts, and its detailed description will be omitted herein. The difference between the 3DIC structures of FIGS. 1H and 2A is in the composition of the dielectric structure. For example, in the embodiment shown in FIG. 1H, the dielectric structure DS includes one unit U. However, in the embodiment shown in FIGS. 2A and 2B, in a 3DIC structure 10A, the dielectric structure DS includes a plurality of units U1, U2. In detail, the dielectric structure DS is disposed between the second dies 200, and the dielectric structure DS includes the dielectric layer BL, the unit U1 and the unit U2 from the outer layer to the inner layer.

In some embodiments, the unit U1 is disposed on and partially surrounded by the dielectric layer BL, and the unit U2 is disposed on and partially surrounded by the unit U1, for example. In some embodiments, material, forming method and configuration of the dielectric layer BL are similar to those of the dielectric layer BL in the 3DIC structure 10. In addition, the unit U2 is the innermost unit, and thus material, forming method and configuration thereof are similar to those of the unit U in the 3DIC structure 10. Thus, the description thereof is omitted herein. The unit U1 would be described in detail below.

In some embodiments, the dielectric layer BS is U-shaped, and the dielectric layer BS has a bottom and a sidewall SWP extending upwards from an edge of the bottom. In some embodiments, the unit U1 has a first dielectric layer F1-1 and a second dielectric layer F1-2, and the unit U2 has a first dielectric layer F2-1 and a second dielectric layer F2-2. The first dielectric layers F1-1, F2-1 are U-shaped, and each first dielectric layer F1-1, F2-1 has a bottom BTP1-1, BTP2-1 and a sidewall SWP1-1, SWP2-1 extending upwards from an edge of the bottom BTP1-1, BTP2-1. The bottom BTP1-1, BTP2-1 has an inner surface IBT1-1, IBT2-1 and an outer surface OBT1-1, OBT2-1 opposite to the inner surface IBT1-1, IBT2-1. In some embodiments, the outer surface OBT1-1, OBT2-1 is a lower surface, and the inner surface IBT1-1, IBT2-1 is an upper surface, for example. Similarly, the sidewall SWP1-1, SWP2-1 has an inner surface ISW1-1, ISW2-1 and an outer surface OSW1-1, OSW2-1 opposite to the inner surface. The inner surface ISW1-1, ISW2-1 of the sidewall SWP1-1, SWP2-1 is physically connected to the inner surface IBT1-1, IBT2-1 of the bottom BTP1-1, BTP2-1, and the outer surface OSW1-1, OSW2-1 of the sidewall SWP1-1, SWP2-1 is physically connected to the outer surface OBT1-1, OBT2-1 of the bottom BTP1-1, BTP2-1. In some embodiments, the second dielectric layer F1-2 of the unit U1 is U-shaped, and the second dielectric layer F1-2 has a bottom and a sidewall SWP1-2 extending upwards from an edge of the bottom. In some embodiments, the second dielectric layer F2-2 of the innermost unit U2 is inverted trapezoid-shaped, for example.

The inner surfaces ISW1-1, ISW2-1 of the first dielectric layer F1-1, F2-1 is the sidewall surface on which the material (such as the material of the second dielectric layer F1-2, F2-2) is subsequently deposited. In some embodiments, the inner surface ISW1-1, ISW2-1 of the sidewall SWP1-1, SWP2-1 slopes more gently than the outer surface OSW1-1, OSW2-1 of the sidewall SWP1-1, SWP2-1. In some embodiments, an included angle θ1, θ1' is formed between the inner surface ISW1-1, ISW2-1 of the sidewall SWP1-1, SWP2-1 and the inner surface IBT1-1, IBT2-1 of the bottom BTP1-1, BTP2-1. In some embodiments, an included angle θ2, θ2' is formed between the outer surface OSW1-1, OSW2-1 of the sidewall SWP1-1, SWP2-1 and the outer surface OBT1-1, OBT2-1 of the bottom BTP1-1, BTP2-1. The included angle θ1 is larger than the included angle θ2, and the included angle θ1' is larger than the included angle θ2'. In some embodiments, the included angle θ1, θ1' is larger than 90 degrees. In some embodiments, the included angle θ2 may be substantially equal to 90 degrees, that is, the sidewall of the dielectric layer BS may be vertical. In some embodiments, the included angle $\theta 2$ may be substantially equal to the included angle $\theta 1$, in other words, the outer surface and the inner surface of the sidewall of the second dielectric layer F1-2 may be substantially parallel to each other.

In some embodiments, a slope of the inner surface ISW1-1 of the sidewall SWP1-1 of the first dielectric layer F1-1 is less than a slope of the inner surface ISW of the sidewall SWP of the dielectric layer BS with respect to the surface 100a of the first die 100. Similarly, a slope of the inner surface ISW2-1 of the sidewall SWP2-1 of the first dielectric layer F2-1 is less than a slope of the inner surface ISW1-2 of the sidewall of the second dielectric layer F1-2 in the unit U1 with respect to the surface 100a of the first die 100. In other words, as compared to the sidewall surface (i.e., the inner surface ISW, ISW1-2 of the sidewall SWP, SWP1-2) of the dielectric layer BS and the second dielectric layer F1-2, the first dielectric layer F1-1, F2-1 provides the inclined sidewall surface (i.e., the inner surface ISW1-1, ISW2-1 of the sidewall SWP1-1, SWP2-1) which is suitable for the deposition process of the second dielectric layer F1-2, F2-2. Thus, by inserting the first dielectric layer F1-1, F2-1 between the dielectric layer BS and the second dielectric layer F1-2 and between the second dielectric layers F1-2, F2-2, the material of the second dielectric layer F1-2, F2-2 may be deposited into the gap between the dies 200 easily and exactly.

In some embodiments, the aspect ratio of the gap G1 between the dies 200 may be high, and after depositing the layers BS, F1-1, F1-2, F2-1 sequentially, aspect ratio of the formed gaps G2, G3, G4 is substantially reduced. For example, the aspect ratio of the gap G1 may be larger than 1.5, the aspect ratio of the gap G2 may be less than 1, the aspect ratio of the gap G3 may be less than 0.8, and the aspect ratio of the gap G4 may be in a range of 0.3 to 0.5. In some embodiments, the thickness of the layer BS on the top portion of the gap G1 may be substantially the same as the thickness of the layer BS on the bottom portion of the gap G1, and the ratio of the thickness to the top width of the gap G1 may be 0.1 to 0.2. In some embodiments, the thickness of the layer F1-1 on the top portion of the gap G2 is smaller than the thickness of the layer F1-1 on the bottom portion of the gap G2, and the ratio of the thickness of the layer F1-1 on the top portion of the gap G2 to the top width of the gap G2 may be 0.2 to 0.3. In some embodiments, the thickness of the layer F1-2 on the top portion of the gap G3 may be substantially the same as the thickness of the layer F1-2 on the bottom portion of the gap G3, and the ratio of the thickness of the layer F1-2 on the top portion of the gap G3 to the top width of the gap G3 may be 0.1 to 0.25. In some embodiments, the thickness of the layer F2-1 on the top portion of the gap G4 may be substantially the same as the thickness of the layer F2-1 on the bottom portion of the gap G4, and the ratio of the thickness of the layer F2-1 on the top portion of the gap G4 to the top width of the gap G4 may be 0.1 to 0.25. In some embodiments, the ratio of the width of the layer F2-2 in the top portion of the gap G5 to the top width of the gap G5 may be less than 0.3.

In some embodiments, the first dielectric layer F1-1, F2-1 may be formed by the non-conformal deposition process such as HDP-CVD or the like. The dielectric layer BS and the second dielectric layer F1-2, F2-2 may be formed by conformal deposition process such as PECVD process or other suitable method. In some embodiments, each unit U1, U2 is formed by the non-conformal deposition process and the conformal deposition process immediately performed after the non-conformal deposition process. In some embodiments, the units U1, U2 may be formed by alternately performing HDP-CVD processes and PECVD processes. In some embodiments, the dielectric layer BS is formed before the units U1, U2, and thus an additional conformal deposition process such as PECVD process may be performed before repeating the cycle of HDP-CVD process and CVD process. In some embodiments, a sandwich structure (i.e., the dielectric layer BS/the first dielectric layer F1-1/the second dielectric layer F1-2 or the second dielectric layer F1-2/the first dielectric layer F2-1/the second dielectric layer F2-2) may be formed as CVD film/HDP-CVD film/CVD film. In some embodiments, the materials of the dielectric layer BS, the first dielectric layer F1-1, F2-1 and the second dielectric layer F1-2, F2-2 may include silicon oxide, silicon nitride or a combination thereof. In some embodiments, the materials of the dielectric layer BS, the first dielectric layer F1-1, F2-1 and the second dielectric layer F1-2, F2-2 may be the same or different.

Figure 3:
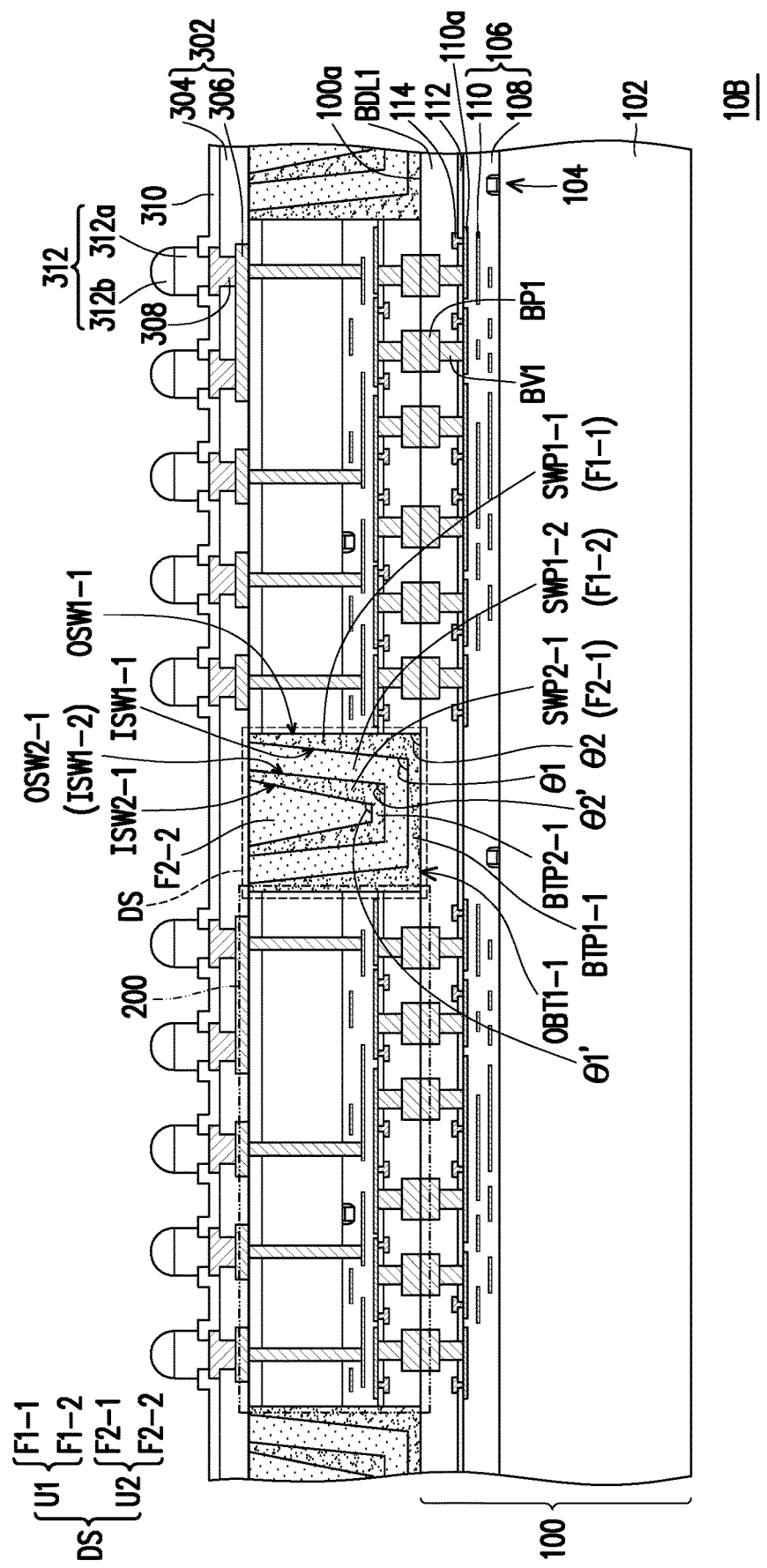
FIG. 3 is a cross-sectional view of a 3DIC structure in accordance with some embodiments of the disclosure.

In some embodiments, only one unit U1 is disposed between the dielectric layer BL and the innermost unit U2, however, the invention is not limited thereto. In some alternative embodiments, a plurality of units may be disposed between the dielectric layer BL and the innermost unit U2, and each unit may have a similar configuration as the unit U1. In addition, in some alternative embodiments, the dielectric layer BL may be omitted. In detail, as shown in FIG. 3, the dielectric structure DS is composed of a plurality of U1, U2, and the outermost unit U1 is in direct contact with the second dies 200. In other words, the first dielectric layer F1-1 is in direct contact with the sidewalls of the second dies 200. The outer surface OSW1-1 of the sidewall SWP1-1 of the first dielectric layer F1-1 is also the sidewalls of the second dies 200, and the outer surface OBT1-1 of the bottom BTP1-1 is also the surface 100a of the first die 100. Accordingly, the outline of the first dielectric layer F1-1 is substantially the same as the gap between the second dies 200. In some embodiments, the outer surface OSW1-1 of the sidewall SWP1-1 of the first dielectric layer F1-1 is substantially vertical to the outer surface OBT1-1 of the bottom BTP1-1, and the included angle $\theta 2$ formed between the outer surface OSW1-1 and the outer surface OBT1-1 is substantially equal to 90 degrees, for example. The included angle $\theta 1$ is larger than the included angle $\theta 2$. A slope of the inner surface ISW1-1 of the sidewall SWP1-1 is less than a slope of the outer surface OSW1-1 of the sidewall SWP1-1 of the first dielectric layer F1-1 with respect to the surface 100a of the first die 100. In other words, compared with a sidewall surface of the second die 200, the first dielectric layer F1-1 provides a sidewall surface (i.e., the inner surface ISW1-1 of the sidewall SWP1-1) suitable for the subsequent deposition process.

In some embodiments, the first dielectric layer of the unit is configured to provide a better profile of the gap for sequential deposition process, and the second dielectric layer of the unit is configured to provide a desired thickness to fill the gap between the dies. In some embodiments, by repeating the cycle including the non-conformal deposition process (e.g., HDP-CVD) and the conformal deposition process (e.g., PECVD), the gap between the second dies may be filled completely and efficiently, and the gap may be formed without a void therein. Accordingly, the performance of the 3DIC structure is improved.

Although the sidewalls of the layers are illustrated as straight sidewalls, the invention is not limited thereto. In some embodiments, the corner formed between the sidewall and the bottom of the layer may be rounded, however, the angle between the sidewall and the bottom may be formed by the tangent line of the sidewall and the tangent line of the bottom of the layer. In addition, it is noted that although the dielectric structures DS in the 3DIC structure 10, 10A are shown as having the same configuration, however, the invention is not limited thereto. In other words, the 3DIC structure may have at least two kinds of dielectric structures DS such as the dielectric structure DS of FIG. 1H and the dielectric structure DS of FIG. 2A.

Conventionally, in order to fill the dielectric material into the gap between the dies, the deposition process such as CVD process may be repeatedly performed. However, after repeatedly performing the deposition processes, the top of the gap gets narrower, and thus the top of the gap may be undesirably sealed by the deposited material before the gap is completely filled. Accordingly, the deposited material in the gap is formed with voids therein, which affects the performance of the 3DIC structure including the dies. In some embodiments, by performing the non-conformal deposition process (e.g., HDP-CVD) before conformal deposition process (e.g., PECVD) or between conformal deposition processes, the sidewall of the gap slopes gently, that is, the top of the gap is wider than the bottom. Therefore, the top of the gap would not be sealed by the deposited material easily before the gap is substantially filled. Accordingly, the gap-filling materials may be filled into the gap without voids therein, and the performance of the 3DIC structure including the dies is improved.

According to some embodiments, a three-dimensional integrated circuit structure includes a first die, a plurality of second dies and a dielectric structure. The second dies are bonded to the first die. The dielectric structure is disposed between the second dies. The dielectric structure includes a first dielectric layer and a second dielectric layer. The first dielectric layer has a sidewall and a bottom, a first surface of the sidewall and a first surface of the bottom are in contact with the second dielectric layer and form a first angle. A second angle smaller than the first angle is formed by a second surface of the sidewall and a second surface of the bottom.

According to some embodiments, a three-dimensional integrated circuit structure includes a first die, a second die, a third die, a first dielectric layer and a second dielectric layer. The second die and the third die are bonded to a surface of the first die. The first dielectric layer and the second dielectric layer are disposed between the second die and the third die. The first dielectric layer includes a sidewall between the second dielectric layer and the second die. The sidewall includes a first surface facing the second dielectric layer and a second surface facing the second die. A first slope of the first surface is smaller than a second slope of the second surface with respect to the surface of the first die.

According to some embodiments, a method of manufacturing a three-dimensional integrated circuit structure includes the following steps. A first die is provided. A plurality of second dies are bonded onto the first die, wherein a gap is formed between the plurality of second dies. A dielectric material is filled in the gap by performing at least one cycle of: by a first deposition process, forming a first dielectric layer having a smaller thickness at a top portion of a sidewall of the gap with respect to a bottom portion of the sidewall of the gap; and by a second deposition process, forming a second dielectric layer on the first dielectric layer over the gap. A portion of the dielectric material is removed to form a dielectric structure between the plurality of second dies, wherein a top surface of the dielectric structure is substantially coplanar with tops surfaces of the plurality of second dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated circuit structure, comprising:
a first die;
a plurality of second dies, bonded to the first die; and
a dielectric structure, disposed between the plurality of second dies, comprising a first dielectric layer and a second dielectric layer, wherein an interface exists between the first dielectric layer and the second dielectric layer, the first dielectric layer has a sidewall and a bottom, a first surface of the sidewall and a first surface of the bottom are in contact with the second dielectric layer and form a first angle, and a second angle smaller than the first angle is formed by a second surface of the sidewall and a second surface of the bottom.

2. The three-dimensional integrated circuit structure according to claim 1, wherein a distance between the first surface of the sidewall and one of the second dies increases as the first surface of the sidewall becomes closer to the bottom.

3. The three-dimensional integrated circuit structure according to claim 1, wherein a thickness between the first and second surfaces of the sidewall increases as the first and second surfaces of the sidewall become closer to the bottom.

4. The three-dimensional integrated circuit structure according to claim 1, wherein the first dielectric layer is disposed between the second dielectric layer and the plurality of second dies.

5. The three-dimensional integrated circuit structure according to claim 1, wherein the second angle is substantially equal to 90 degrees.

6. The three-dimensional integrated circuit structure according to claim 1, wherein top surfaces of the first dielectric layer and the second dielectric layer are substantially flush with top surfaces of the plurality of second dies.

7. The three-dimensional integrated circuit structure according to claim 1, wherein the first dielectric layer is U-shaped.

8. The three-dimensional integrated circuit structure according to claim 1, wherein the dielectric structure further comprises a third dielectric layer between the first dielectric layer and the plurality of second dies, and the third dielectric layer is in contact with the second surface of the sidewall and the second surface of the bottom.

9. The three-dimensional integrated circuit structure according to claim 1, wherein the dielectric structure comprises a plurality of first dielectric layers and a plurality of second dielectric layers alternately disposed.

10. A three-dimensional integrated circuit structure, comprising:
a first die;
a second die and a third die, bonded to a surface of the first die; and a first dielectric layer and a second dielectric layer, disposed between the second die and the third die, the first dielectric layer comprising a sidewall between the second dielectric layer and the second die, the sidewall including a first surface facing the second dielectric layer and a second surface facing the second die, wherein an interface exists between the first dielectric layer and the second dielectric layer, and a first slope of the first surface is smaller than a second slope of the second surface with respect to the surface of the first die.

11. The three-dimensional integrated circuit structure according to claim 10, wherein a distance between the first surface of the sidewall and the second die increases as the first surface becomes closer to the surface of the first die.

12. The three-dimensional integrated circuit structure according to claim 10, further comprising a third dielectric layer between the first dielectric layer and the second die, wherein the second surface is in contact with the third dielectric layer.

13. The three-dimensional integrated circuit structure according to claim 10, wherein the second surface is substantially parallel to a sidewall of the second die that is perpendicular to the surface of the first die.

14. The three-dimensional integrated circuit structure according to claim 10, wherein a distance between the first surface and the second surface increases as the first surface becomes closer to the surface of the first die.

15. The three-dimensional integrated circuit structure according to claim 10, further comprising a third dielectric layer between the first dielectric layer and the second dielectric layer, wherein the third dielectric layer has a substantially constant thickness over the first dielectric layer.

16. A three-dimensional integrated circuit structure, comprising:

a first die, comprising a first substrate and a plurality of first pads;

a second die, comprising a second substrate and a plurality of second pads, the second die bonded to the first die through the plurality of first pads and the plurality of second pads between the first substrate and the second substrate; and a dielectric structure, disposed over the first die and encapsulating the second die, comprising a first dielectric layer and a second dielectric layer, the first dielectric layer being between the second die and second dielectric layer, wherein an interface exists between the first dielectric layer and the second dielectric layer, and a thickness of the first dielectric layer at a top portion of the second die is smaller than at a bottom portion of the second die.

17. The three-dimensional integrated circuit structure according to claim 16, wherein the thickness of the first dielectric layer increases as the first dielectric layer becomes closer to the bottom portion of the second die.

18. The three-dimensional integrated circuit structure according to claim 16, wherein a top surface of the first dielectric layer is substantially coplanar with a top surface of the second dielectric layer.

19. The three-dimensional integrated circuit structure according to claim 16, wherein a top surface of the dielectric structure is substantially coplanar with a top surface of the second die.

20. The three-dimensional integrated circuit structure according to claim 16, wherein the dielectric structure further comprises a third dielectric layer between the first dielectric layer and the second dielectric layer, and the third dielectric layer has a substantially constant thickness at the top portion and the bottom portion of the second die.

* * * * *